(12) United States Patent
Siciliani et al.

(10) Patent No.: US 10,387,060 B2
(45) Date of Patent: *Aug. 20, 2019

(54) MEMORY DEVICE CONFIGURATION COMMANDS

(71) Applicant: Micron Technology, Inc., Boise, ID (US)

(72) Inventors: Umberto Siciliani, Rubano (IT); Anna Chiara Siviero, Albignasego (IT); Andrea Smaniotto, Albignasego (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/939,459

(22) Filed: Mar. 29, 2018

(65) Prior Publication Data
US 2018/0217773 A1 Aug. 2, 2018

Related U.S. Application Data

(63) Continuation of application No. 15/264,888, filed on Sep. 14, 2016, now Pat. No. 9,940,052.

(51) Int. Cl.
*G11C 16/04* (2006.01)
*G06F 3/06* (2006.01)
(Continued)

(52) U.S. Cl.
CPC .......... *G06F 3/0629* (2013.01); *G06F 3/0604* (2013.01); *G06F 3/0659* (2013.01);
(Continued)

(58) Field of Classification Search
CPC .... G06F 3/0629; G06F 3/0604; G06F 3/0659; G06F 3/0673; G11C 11/5628;
(Continued)

(56) References Cited

U.S. PATENT DOCUMENTS 7,075,822 B2 * 7/2006 Elmhurst ................ G11C 11/56
365/185.03
7,634,697 B2 * 12/2009 Ha ........................ G11C 7/1045
711/154

(Continued)

FOREIGN PATENT DOCUMENTS

TW        201227506 A     7/2012
WO     20120174216 A2   12/2012

OTHER PUBLICATIONS

International Search Report and Written Opinion from related patent application No. PCT/US2017/048811, dated Dec. 11, 2017, 23 pp.

(Continued)

*Primary Examiner* — Pho M Luu
(74) *Attorney, Agent, or Firm* — Brooks, Cameron & Huebsch, PLLC

(57) ABSTRACT

Apparatuses and methods for configuring a memory device using configuration commands are provided. A method can include executing a first command while the memory device is in a ready state to configure the memory device to a particular mode and executing a second command to perform a first operation while the memory device is in the particular mode.

20 Claims, 4 Drawing Sheets

(51) Int. Cl.
   *G11C 16/06* (2006.01)
   *G11C 11/56* (2006.01)
(52) U.S. Cl.
   CPC ........ *G06F 3/0673* (2013.01); *G11C 11/5628* (2013.01); *G11C 11/5642* (2013.01); *G11C 16/04* (2013.01); *G11C 16/06* (2013.01); *G11C 16/0483* (2013.01); *G11C 2211/5641* (2013.01)
(58) Field of Classification Search
   CPC ..... G11C 11/5642; G11C 16/04; G11C 16/06; G11C 16/0483; G11C 2211/5641
   See application file for complete search history.

(56) References Cited

U.S. PATENT DOCUMENTS

| | | | |
|---|---|---|---|
| 7,936,610 B1 * | 5/2011 | Melcher | G11C 16/06 365/185.03 |
| 8,281,042 B2 | 10/2012 | Son et al. | |
| 8,433,845 B2 | 4/2013 | Borchers et al. | |
| 8,619,493 B2 | 12/2013 | Kim | |
| 9,196,376 B2 | 11/2015 | Shin et al. | |
| 9,229,655 B2 | 1/2016 | Lassa et al. | |
| 9,940,052 B2 * | 4/2018 | Siciliani | G06F 3/0604 |
| 2012/0331337 A1 | 12/2012 | Otsuka | |
| 2013/0227203 A1 | 8/2013 | Marotta et al. | |
| 2013/0318285 A1 | 11/2013 | Pignatelli | |
| 2014/0006688 A1 | 1/2014 | Yu et al. | |
| 2014/0156213 A1 | 6/2014 | Lee | |
| 2014/0181365 A1 | 6/2014 | Fanning et al. | |
| 2015/0339076 A1 | 11/2015 | Matsui et al. | |

OTHER PUBLICATIONS

Office Action from related Taiwanese patent application No. 106129583, dated Nov. 30, 2018, 13 pp.

* cited by examiner

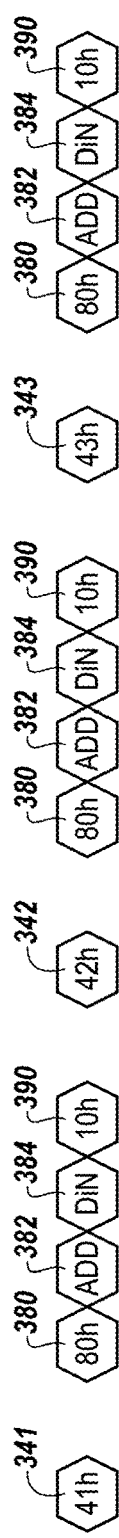
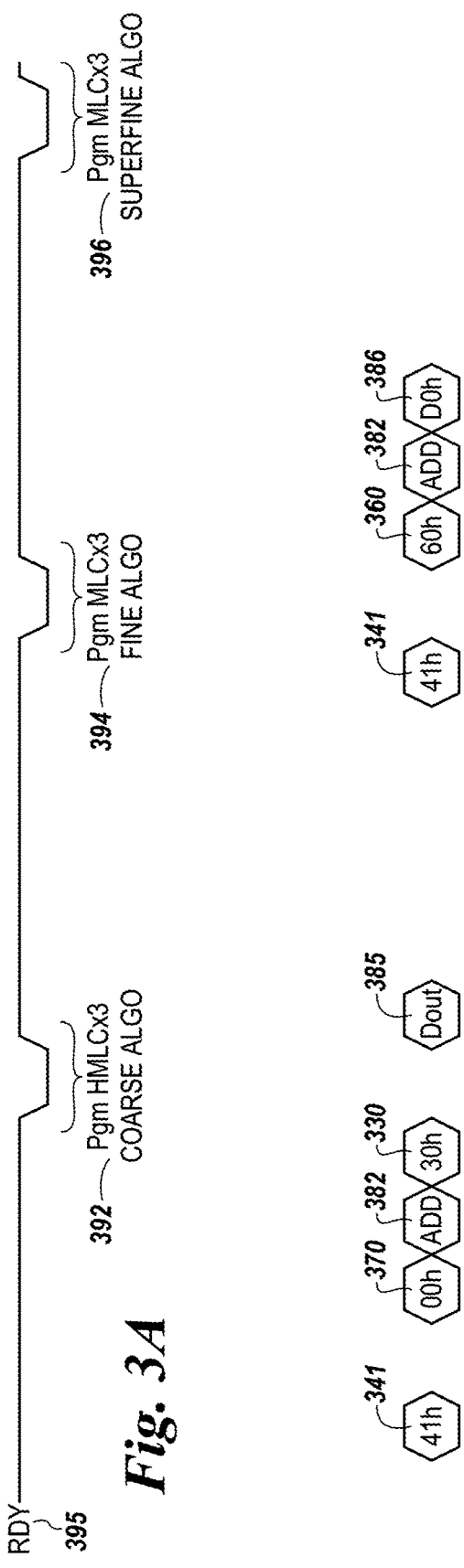
Fig. 3A
Fig. 3B
Fig. 3C

| COMMAND | TYPE | NUMBER OF BITS PER CELL | PROGRAMMING ALGORITHM |
|---|---|---|---|
| 40h | SLC | 1 | |
| 41h | MLC | 3 | COARSE |
| 42h | MLC | 3 | FINE |
| 43h | MLC | 3 | SUPERFINE |
| 44h | MLC | 2 | COARSE |
| 45h | MLC | 2 | FINE |
| 46h | MLC | 1 | |

*Fig. 4*

MEMORY DEVICE CONFIGURATION COMMANDS

PRIORITY APPLICATION

This application is a Continuation of U.S. application Ser. No. 15/264,888, filed Sep. 14, 2016, now U.S. Pat. No. 9,940,052, the contents of which are included herein by reference.

TECHNICAL FIELD

The present disclosure relates generally to memory devices, and more particularly, to apparatuses and methods for configuring a memory device using configuration commands.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIGS. 3A-3C illustrate timing diagrams using configuration commands in accordance with one or more embodiments of the present disclosure.

FIG. 4 is a table illustrating configuration commands in accordance with a number of embodiments of the present disclosure.

DETAILED DESCRIPTION

Figure 1:
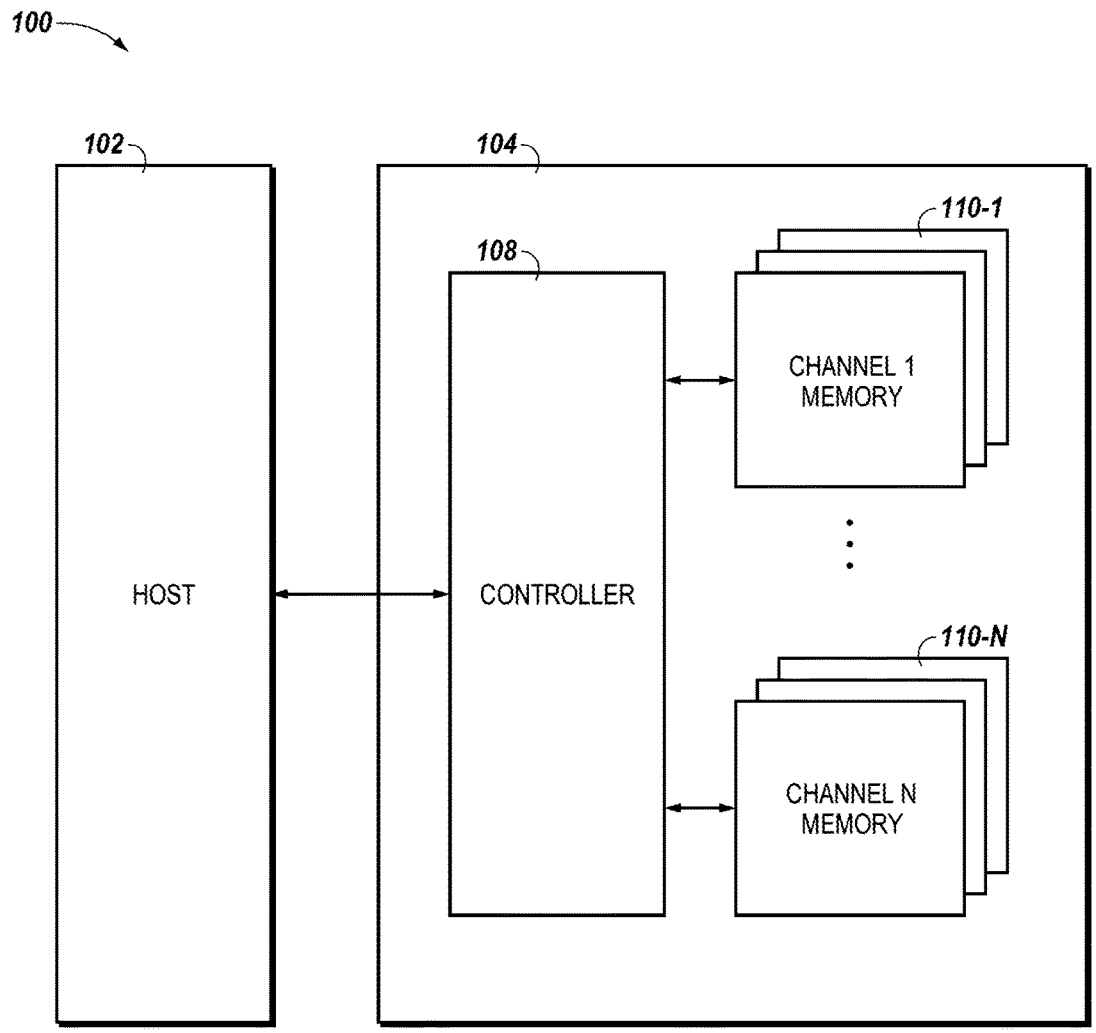
FIG. 1 is a block diagram of an apparatus in the form of a computing system including a memory system in accordance with a number of embodiments of the present disclosure.

Apparatuses and methods for configuring a memory device using configuration commands are provided. One example method can include executing a first command while the memory device is in a ready state to configure the memory device to a particular mode and executing a second command to perform a first operation while the memory device is in the particular mode.

In a number of embodiments, a number of configuration commands can be used to cause memory devices to operate in a number of modes. For example, a memory device can be configured to operate single level cell (SLC) mode, in which each cell is programmable to one of two states, storing one bit of information per cell. A memory device can also be configured to operate in a multi-level cell (MLC) mode, in which each cell is programmable to one of a number of states, storing one or more bits of information per cell. As an example, the memory device can be configured to operate in a 2-bit per cell MLC mode or in a 3-bit per cell MLC mode.

In one or more embodiments of the present disclosure, a number of configuration commands can be used to place the memory device in one of a number of modes indicated by the configurations commands. The configuration commands can be issued by a host and executed by the memory device to place the memory device in a particular configuration. For example, the configuration commands can cause the memory device to operate as a SLC device or as an MLC device. The configuration commands can designate the particular number of bits stored per cell (e.g., 1, 2, or 3, etc.). The configuration commands can cause the memory device to program the memory cells in accordance with a particular programming algorithm (e.g., course, fine, or superfine), which can indicate the quantity of programming signals used to place the memory cell in a desired state, for example.

The number of configuration commands can be issued and executed while the memory device is in a ready state and the host and/or memory device do not use a command queue for execution of the configuration commands, therefore there is not a data input phase that would use bus bandwidth between a memory system and a host. In previous approaches, a set feature and/or a multi-level block instruction was used to configure a memory device, which required the host and/or memory device to use a command queue, transfer data on the bus between the memory device and the host, and execution of the instructions caused the memory device to be in a busy state.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of an apparatus in the form of a computing system 100 including at least one memory system 104 in accordance with one or more embodiments of the present disclosure. As used herein, an "apparatus" can refer to, but is not limited to, a variety of structures or combinations of structures, such as a circuit or circuitry, a die or dice, a module or modules, a device or devices, or a system or systems, for example. In the embodiment illustrated in FIG. 1, the memory system 104 can include a controller 108 and one or more memory devices 110-1, . . . , 110-N. In this example, the controller 108 is external to the one or more memory devices 110-1, . . . , 110-N. The memory devices 110-1, . . . , 110-N can provide a storage volume for the memory system (e.g., with a file system formatted to the memory devices). In a number of embodiments, the number of memory devices 110-1, . . . , 110-N can include non-volatile memory including a number of logical units (LUNs). A LUN can be a portion of non-volatile memory that can be independently controllable. The controller 108 can include control circuitry (e.g., hardware, firmware, and/or software). In one or more embodiments, the controller 108 can be an application specific integrated circuit (ASIC) coupled to a printed circuit board including a physical interface and memory devices 110-1, . . . , 110-N. Also, the controller can include volatile and/or non-volatile memory.

As illustrated in FIG. 1, a host 102 can be coupled to the memory system 104. Host 102 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, . . . , 110-N to read, write, and erase data, among other operations. Controller 108 can have circuitry that may be one or more integrated circuits and/or discrete components. A controller could selectively couple an I/O connection (not shown in FIG. 1) of a memory device 110-1, . . . , 110-N to receive the appropriate signal at the appropriate I/O connection at the appropriate time. Similarly, the communication protocol between a host 102 and the memory system 104 may be different than what is required for access of a memory device 110-1, . . . , 110-N. Controller 108 can translate the commands received from a host into the appropriate commands to achieve the desired access to a memory device 110-1, . . . , 110-N.

In a number of embodiments, a number of configuration commands can be used to cause memory devices to operate in a number of modes. A number of commands, such as commands 40h, 41h, 42h, 43h, 44h, 45h, and 46h, described below in association with FIGS. 3A-4, can be used to configure a memory device to operate single level cell (SLC) mode, in which each cell is programmable to one of two states, storing one bit of information per cell or in a multi-level cell (MLC) mode, in which each cell is programmable to one of a number of states, storing one or more bits of information per cell. The configuration commands can be used to configure a memory device to operate with a particular number of bits stored in each cell when the device is configured to operate as a multi-level cell. The configuration commands can be used to configure a memory device to program the memory cells using a particular programming algorithm.

A memory device 110-1, . . . , 110-N can include one or more arrays of memory cells (e.g., non-volatile memory cells). The arrays can be flash arrays with a NAND architecture, for example. Embodiments are not limited to a particular type of memory device. For instance, the memory device can include volatile and/or non-volatile memory, such as flash memory, resistance variable memory, and/or DRAM, among others.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading (e.g., a number of cells that are written and/or read together or as a functional group of memory cells). An even page and an odd page can be written and/or read with separate writing and/or reading operations. For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, ..., 110-N. It will be appreciated by those skilled in the art that the number of address input connections can depend on the density and architecture of the memory devices 110-1, ..., 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with a logical block address (LBA). As an example, a physical page can have 8 physical sectors of data. However, embodiments are not limited to a particular number of physical sectors per physical page.

Figure 2:
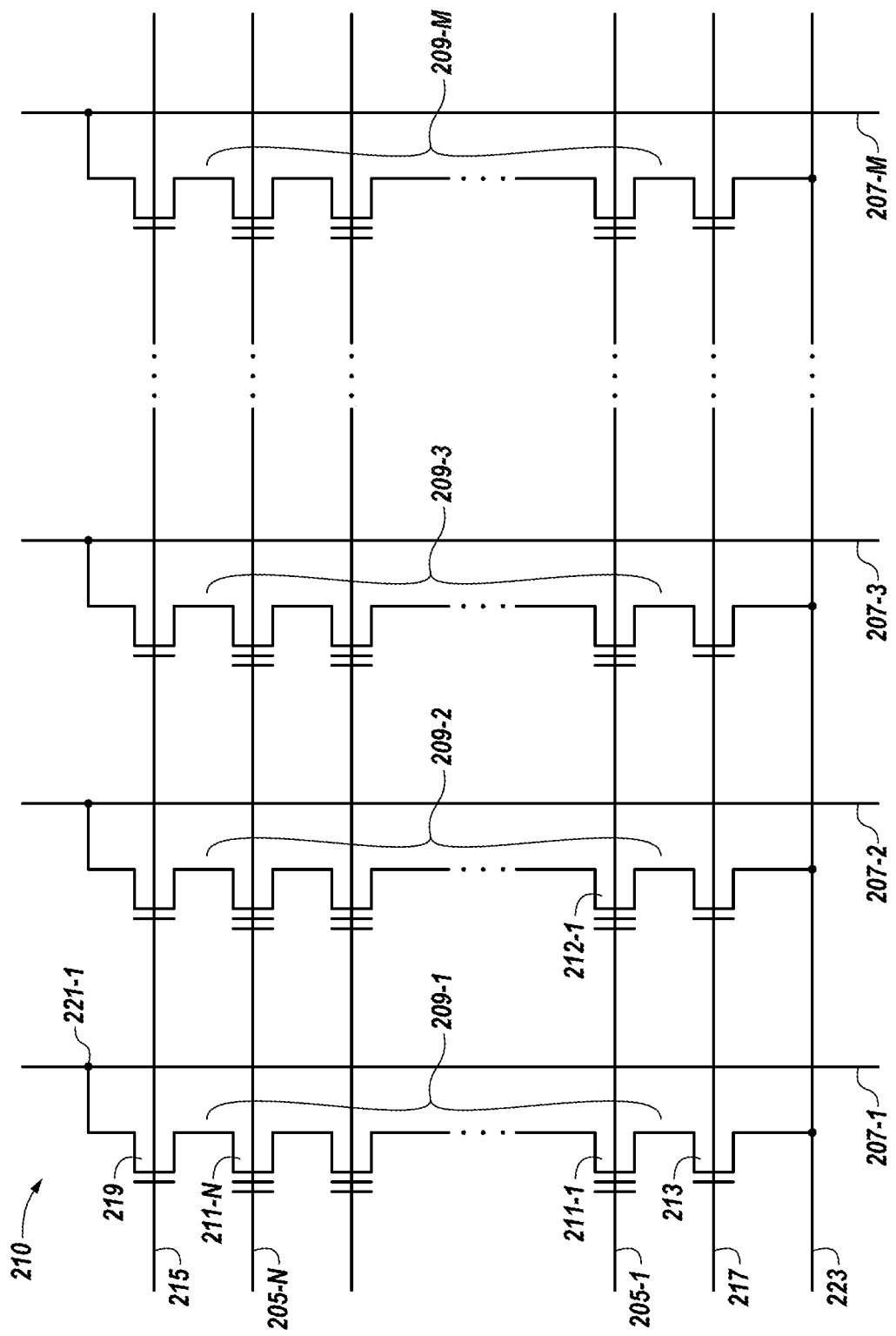
FIG. 2 is a schematic of a portion of memory comprising an array of memory cells operable in accordance with a number of embodiments of the present disclosure.

FIG. 2 is a schematic of a portion of memory 210 comprising an array of memory cells operable in accordance with a number of embodiments of the present disclosure. The embodiment of FIG. 2 illustrates a NAND architecture non-volatile memory array; however, embodiments described herein are not limited to this example. For example, a number of embodiments can implemented to a NOR architecture non-volatile memory array. As shown in FIG. 2, the memory array includes access lines (e.g., word lines 205-1, ..., 205-N) and intersecting data lines (e.g., local bit lines 207-1, 207-2, 207-3, ..., 207-M). For ease of addressing in the digital environment, the number of word lines 205-1, ..., 205-N and the number of local bit lines 207-1, 207-2, 207-3, ..., 207-M can be some power of two (e.g., 256 word lines by 4,096 bit lines).

The memory array includes NAND strings 209-1, 209-2, 209-3, ..., 209-M. Each NAND string includes non-volatile memory cells 211-1, ..., 211-N, each communicatively coupled to a respective word line 205-1, ..., 205-N. Each NAND string (and its constituent memory cells) is also associated with a local bit line 207-1, 207-2, 207-3, ..., 207-M. The memory cells 211-1, ..., 211-N of each NAND string 209-1, 209-2, 209-3, ..., 209-M are coupled in series source to drain between a select gate source (e.g., a field-effect transistor (FET) 213) and a select gate drain (e.g., FET 219). Each select gate source 213 is configured to selectively couple a respective NAND string to a common source 223 responsive to a signal on source select line 217, while each select gate drain 219 is configured to selectively couple a respective NAND string to a respective bit line responsive to a signal on drain select line 215.

As shown in the embodiment illustrated in FIG. 2, a source of select gate source 213 is coupled to a common source line 223. The drain of select gate source 213 is coupled to the source of the memory cell 211-1 of the corresponding NAND string 209-1. The drain of select gate drain 219 is coupled to bit line 207-1 of the corresponding NAND string 209-1 at drain contact 221-1. The source of select gate drain 219 is coupled to the drain of the last memory cell 211-N (e.g., a floating-gate transistor) of the corresponding NAND string 209-1.

In a number of embodiments, construction of the non-volatile memory cells 211-1, ..., 211-N includes a source, a drain, a floating gate or other charge storage structure, and a control gate. The memory cells 211-1, ..., 211-N have their control gates coupled to a word line, 205-1, ..., 205-N, respectively. A NOR array architecture would be similarly laid out, except that the string of memory cells would be coupled in parallel between the select gates. For example, one end of each memory cell (e.g., a memory cell 211-N as illustrated in FIG. 2) can be coupled to a bit line, and another end of the same memory cell can be coupled to a source line that can be aligned in parallel with the bit line. Furthermore, a NOR architecture can provide for random access to the memory cells in the array (e.g., as opposed to page-based access as with a NAND architecture).

In operation, a number of memory cells coupled to a selected word line (e.g., 205-1, ..., 205-N) can be written and/or read together as a group. A group of memory cells written and/or read together can be referred to as a page of cells (e.g., a physical page) and can store a number of pages of data (e.g., logical pages). A number of memory cells coupled to a particular word line and programmed together to respective data states can be referred to as a target page. A programming operation can include applying a number of program pulses (e.g., 16V-20V), which correspond to a particular programming algorithm that is being used to program the memory cell, to a selected word line in order to increase the threshold voltage (Vt) of selected cells coupled to that selected word line to a desired voltage level corresponding to a targeted data state. In a number of embodiments, a particular programming algorithm, such as coarse, fine, and/or superfine, can use a number programming pulses to program the memory cells to a desired state. A programming algorithm having more programming pulses can program memory cells to their desired state with more accuracy than programming algorithms with fewer programming pulses, which can be useful to maintain read margins when memory cells are storing multiple bits of data and/or to reduce the bit error rate for the memory cells. Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

FIGS. 3A-3C illustrate timing diagrams using configuration commands in accordance with one or more embodiments of the present disclosure. FIG. 3A illustrates a timing diagram using a number of configuration commands when performing a number of write operations. FIG. 3A includes a configuration command 341 ("41h"). The 41h command is a configuration command that places the memory device in a multilevel cell mode with 3 bits per cell that programs memory cells using a coarse programming algorithm. Once the memory cell has been placed in the mode indicated by the 41h command, a write command 380 ("80h"), can be issued, which includes an address phase 382 ("ADD"), and a data input phase 384 ("DiN"). Once address phase 382 and data input phase 384 associated with write command 380 has been executed, a write command 390 ("10h") can be issued causing a course programming algorithm 392 to be executed. The course programming algorithm can be executed to program memory cells with 3 bits per cell, as indicated by the configuration command 341. The memory device can be in the ready state when issuing and executing the configuration command 341 and the write commands 380 and 390. In a number of embodiments, the configuration command 341 does not use the command queue on a host and/or the memory device. The configuration command also does not include a data transfer phase that uses bus bandwidth between a host and the memory system, which would cause the memory system to be in a busy state.

In FIG. 3A, another write command can be executed following the first write command. A configuration command 342 ("42h"), can be issued following the course programming algorithm 392. The 42h command is a configuration command that places the memory device in a multilevel cell mode with 3 bits per cell that programs memory cells using a fine programming algorithm. Once the memory cell has been placed in the mode indicated by the 42h command, write command 380 ("80h"), can be issued, which includes an address phase 382 ("ADD") and a data input phase 384 ("DiN"). Once address phase 382 and data input phase 384 associated with write command 380 has been executed, a write command 390 can be issued causing a fine programming algorithm 394 to be executed. The fine programming algorithm can be executed to program memory cells with 3 bits per cell, as indicated by configuration command 342.

In FIG. 3A, another write command can be executed following the second write command. A configuration command 343 ("43h"), can be issued following the fine programming algorithm 394. The 43h command is a configuration command that places the memory device in a multilevel cell mode with 3 bits per cell that programs memory cells using a superfine programming algorithm. Once the memory cell has been placed in the mode indicated by the 43h command, write command 380 ("80h"), can be issued, which includes an address phase 382 ("ADD") and a data input phase 384 ("DiN"). Once address phase 382 and data input phase 384 associated with write command 380 has been executed, a write command 390 can be issued causing a superfine programming algorithm 396 to be executed. The superfine programming algorithm can be executed to program memory cells with 3 bits per cell, as indicated by configuration command 343.

FIG. 3B illustrates a timing diagram using a configuration command when performing a read operation. FIG. 3A includes a configuration command 341 ("41h"). The 41h command is a configuration command that places the memory device in a multilevel cell mode with 3 bits per cell that programs memory cells using a coarse programming algorithm. Command 42h or 43h could have also been issued in this example because those commands also place the memory device in a multilevel cell state with 3 bits per cell. Commands 41h, 42h, and 43h all configure the memory device in a multilevel cell state with 3 bits per cell, but each use different programming algorithms. Since the example in FIG. 3B is directed to a read operation, the programming algorithm indicated by the configuration command is not used and would not affect the read operation.

Once the memory cell has been placed in the mode indicated by the 41h command, read command 370 ("00h") can be issued, which includes an address phase 382 ("ADD"). Once address phase 382 has been executed, a read command 330 ("30h") can be issued causing a read algorithm 398 to be executed. The data output phase 385 ("Dout") can follow the read algorithm 398 to transfer the data read from the memory device to the requesting device (e.g., host 102). The memory device can be in the ready state when issuing and executing the configuration command 341 and the read commands 370 and 330. In a number of embodiments, execution of the configuration command 341 is complete while the device is in a ready state (e.g., not a busy state) and does not use the command queue on a host and/or the memory device. The configuration command also does not include a data transfer phase that uses bus bandwidth between a host and the memory system.

FIG. 3C illustrates a timing diagram using a configuration command when performing an erase operation. FIG. 3A includes a configuration command 341 ("41h"). The 41h command is a configuration command that places the memory device in a multilevel cell mode with 3 bits per cell that programs memory cells using a coarse programming algorithm. Similar to the discussion above regarding the read operation example of FIG. 3B, command 42h or 43h could have also been issued in this example since the example in FIG. 3C is directed to an erase operation and the programming algorithm indicated by the configuration command 41h, 42h, and 43h is not used and would not affect the erase operation.

Once the memory cell has been placed in the mode indicated by the 41h command, erase command 360 ("60h") can be issued, which includes an address phase 382 ("ADD"). Once address phase 382 associated with erase command 360 has been executed, erase command 386 ("D0h") can be issued causing an erase algorithm to be executed, which erases the block indicated by erase command 360. The memory device can be in the ready state while issuing and executing the configuration command 341 and the erase commands 360 and 386. In a number of embodiments, the configuration command 341 does not use the command queue on a host and/or the memory device. The configuration command also does not include a data transfer phase that uses bus bandwidth between a host and the memory system, which would cause the memory device to be in a busy state.

In a number of embodiments, each of the write commands 380 and 390, read commands 370 and 330, and the erase commands 360 and 386 can include instructions to execute the command on a particular LUN. For example, once a configuration command (e.g., commands 341, 342, . . . , 347) has been issued, a read, write, or erase command can be issued that includes instructions to perform the command on a particular LUN of the memory device. Therefore, configuration commands can place the entire device in a particular configuration while the memory device is in a ready state and does not include a data transfer on the bus between the host and the memory device and then read, write, and/or erase commands can be executed on particular LUNs of the memory device. When issuing read, write, and/or erase commands on particular LUNs of the memory device, the particular LUN may be polled to ensure that the LUN is in a ready state and can execute the read, write, and/or erase command. Also, a by-LUN command ("78h") can be used to active a particular mode and deactivate the remaining LUNs. A configuration command (e.g., commands 341, 342, . . . , 347) can be then executed, followed by a read, write, and/or erase command to perform an operation on the LUN indicated by the 78h command in the mode indicated by the configuration commands.

FIG. 4 is a table of a number of configuration commands in accordance with a number of embodiments of the present disclosure. Configuration commands can be issued and executed while a memory device is in a ready state, as opposed to set commands which when executed cause the memory device to be in a busy state, to enable the memory device to operate in particular modes. In the example shown in FIG. 4, a number of configuration commands 440, 441, 442, 443, 444, 445, and 446, can be used to cause a memory device to operate in particular modes. Each of the configuration commands 440, 441, 442, 443, 444, 445, and 446, can include a command name 438 and can be associated with a particular mode that can indicate the memory cell type 430, the number of bits per cell associated with the memory cells 432, and/or a programming algorithm 436 used to program the memory cell.

In the example shown in FIG. 4, command 440, indicated as 40h can cause the memory device to operate as single level cell (SLC) with 1 bit per cell. Command 441, indicated as 41h, can cause the memory device operate as a multi-level cell (MLC) with 3 bits per cell and use a coarse programming algorithm to program the memory cells. Command 442, indicated as 42h, can cause the memory device operate as a multi-level cell (MLC) with 3 bits per cell and use a fine programming algorithm to program the memory cells. Command 443, indicated as 43h, can cause the memory device operate as a multi-level cell (MLC) with 3 bits per cell and use a superfine programming algorithm to program the memory cells. Command 444, indicated as 44h, can cause the memory device operate as a multi-level cell (MLC) with 2 bits per cell and use a coarse programming algorithm to program the memory cells. Command 445, indicated as 45h, can cause the memory device operate as a multi-level cell (MLC) with 2 bits per cell and use a fine programming algorithm to program the memory cells. Command 446, indicated as 46h, can cause the memory device operate as a multi-level cell (MLC) with 1 bit per cell.

Each of the configuration commands 440, 441, 442, 443, 444, 445, and 446 can be issued and executed while the memory device is in a ready state and the host and/or memory device do not use a command queue for execution of the configuration commands, therefore there is not a data input phase that would use bus bandwidth between a memory system and a host. In previous approaches, a set feature and/or a multi-level block instruction was used to configure a memory device, which required the host and/or memory device to use a command queue, transfer data on the bus between the memory device and the host, and execution of the instructions caused the memory device to be in a busy state.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for configuring a memory device, comprising:
executing a command while the memory device is in a ready state to configure the memory device to a particular mode, wherein the particular mode defines a particular programming algorithm.

2. The method of claim 1, wherein the particular mode defines number of bits stored per memory cell.

3. The method of claim 1, wherein the method includes executing another command to perform an operation while the memory device is in the particular mode.

4. The method of claim 1, wherein executing the command to configure the memory device to the particular mode includes configuring the memory device to a single level cell mode.

5. The method of claim 1, wherein executing the command to configure the memory device to the particular mode includes configuring the memory device to a multi-level cell mode.

6. The method of claim 1, wherein the method includes executing another command to configure the memory device to another mode different from the particular mode.

7. The method of claim 1, wherein the method includes executing another command to perform an operation on a first logical unit (LUN) of the memory device while the memory device is in the particular mode.

8. A method for configuring a memory device, comprising:
sending a command to the memory device, wherein the command includes instructions to configure the memory device to a particular mode and the particular mode defines a particular programming algorithm; and
configuring the memory device to the particular mode by executing the command while the memory device is in a ready state.

9. The method of claim 8, wherein the method includes executing the command without transferring data on a data bus between the memory device and a host.

10. The method of claim 8, wherein the method includes executing another command to write data to the memory device.

11. The method of claim 8, wherein the method includes executing another command to read data from the memory device.

12. The method of claim 8, wherein the method includes executing another command to erase data from the memory device.

13. An apparatus, comprising:
an array of memory cells of a memory device; and
a controller coupled to the array of memory cells, the controller configured to:
execute a first command to configure the memory device to a particular mode while the memory device is in a ready state, wherein the particular mode defines a particular programming algorithm; and
execute a second command to perform while the memory device is in the particular mode.

14. The apparatus of claim 13, wherein the controller is configured to execute a third command to configure the memory device to another mode different from the particular mode.

15. The apparatus of claim 13, wherein the particular mode defines a number of bits per cell.

16. The apparatus of claim 13, wherein the particular programming algorithm is selected from a group including a course programming algorithm, a fine programming algorithm, and a superfine programming algorithm.

17. The apparatus of claim 13, wherein the first command is not placed in a command queue for execution.

18. The apparatus of claim 13, wherein execution of the first command does not include a data transfer phase.

19. The apparatus of claim 13, wherein the second command is a read operation.

20. The apparatus of claim 13, wherein the second command is a write operation.

* * * * *